(12) United States Patent
Dutta et al.

(10) Patent No.: US 11,923,311 B2
(45) Date of Patent: Mar. 5, 2024

(54) FORMING SELF-ALIGNED MULTI-METAL INTERCONNECTS

(71) Applicant: INTERNATIONAL BUSINESS MACHINES CORPORATION, Armonk, NY (US)

(72) Inventors: Ashim Dutta, Menands, NY (US); Ekmini Anuja De Silva, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/737,212

(22) Filed: May 5, 2022

(65) Prior Publication Data
US 2022/0262736 A1  Aug. 18, 2022

Related U.S. Application Data

(62) Division of application No. 16/409,379, filed on May 10, 2019, now Pat. No. 11,355,442.

(51) Int. Cl.
*H01L 23/528* (2006.01)
*H01L 21/768* (2006.01)
*H01L 23/532* (2006.01)
*H01L 23/538* (2006.01)

(52) U.S. Cl.
CPC .... *H01L 23/5386* (2013.01); *H01L 21/76838* (2013.01); *H01L 23/53228* (2013.01); *H01L 23/53257* (2013.01)

(58) Field of Classification Search
CPC .. H01L 23/528; H01L 29/40; H01L 29/41725
See application file for complete search history.

(56) References Cited

U.S. PATENT DOCUMENTS

| | | | | |
|---|---|---|---|---|
| 5,384,479 A | * | 1/1995 | Taniguchi | ......... H01L 21/28114 257/E21.205 |
| 5,789,316 A | * | 8/1998 | Lu | ..................... H01L 21/76831 438/639 |
| 7,393,781 B2 | | 7/2008 | Yakobson | |

(Continued)

FOREIGN PATENT DOCUMENTS

CN    204058588 U    12/2014

OTHER PUBLICATIONS

List of IBM Patents or Patent Applications Treated as Related; Date Filed: May 5, 2022, 2 pages.

*Primary Examiner* — Michele Fan
(74) *Attorney, Agent, or Firm* — CANTOR COLBURN LLP; Joseph P. Curcuru

(57) ABSTRACT

An interconnect structure is provided. The interconnect structure includes first conducting lines and second conducting lines. The first conducting lines are formed of a first metallic material and include at least one individual first conducting line in contact with a first corresponding substrate conducting line. The second conducting lines are formed of a second metallic material and include at least one individual second conducting line between neighboring first conducting lines and in contact with a second corresponding substrate conducting line. The at least one individual second conducting line is separated from each of the neighboring first conducting lines by controlled distances.

18 Claims, 4 Drawing Sheets

(56) References Cited

U.S. PATENT DOCUMENTS

| | | |
|---|---|---|
| 8,907,497 B2 | 12/2014 | Chang |
| 9,059,166 B2 | 6/2015 | Filippi |
| 9,595,441 B2 | 3/2017 | Devilliers |
| 9,627,310 B2 | 4/2017 | Chang |
| 9,716,032 B2 | 7/2017 | Tang |
| 9,716,038 B2 | 7/2017 | Chen |
| 9,741,920 B1 | 8/2017 | Tolpygo |
| 9,837,354 B2 | 12/2017 | Liu |
| 9,911,849 B2 | 3/2018 | Basker |
| 10,121,699 B2 | 11/2018 | Wang |
| 2004/0180483 A1 | 9/2004 | Park |
| 2005/0148130 A1 | 7/2005 | Doczy |
| 2005/0242386 A1 | 11/2005 | Ang |
| 2008/0274282 A1 | 11/2008 | Bent |
| 2013/0134598 A1* | 5/2013 | Anderson ........... H01L 29/7824 438/618 |
| 2017/0148876 A1 | 5/2017 | Cheng |
| 2017/0154806 A1 | 6/2017 | Wang |
| 2018/0164698 A1 | 6/2018 | Yang |
| 2018/0342585 A1* | 11/2018 | Lu ........................ H01L 29/785 |
| 2020/0350419 A1 | 11/2020 | Ma |
| 2020/0357748 A1 | 11/2020 | Dutta |

\* cited by examiner

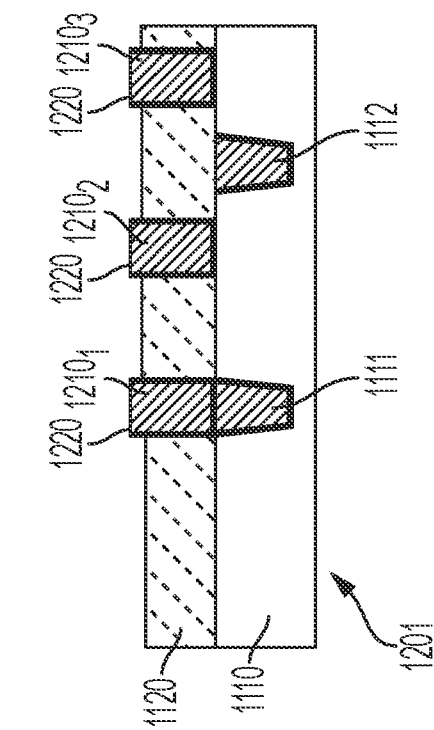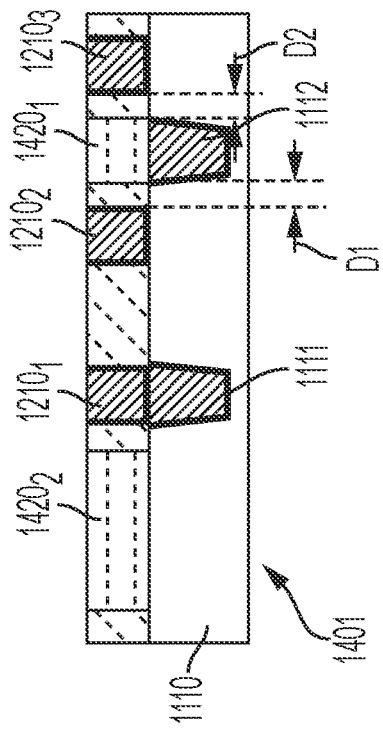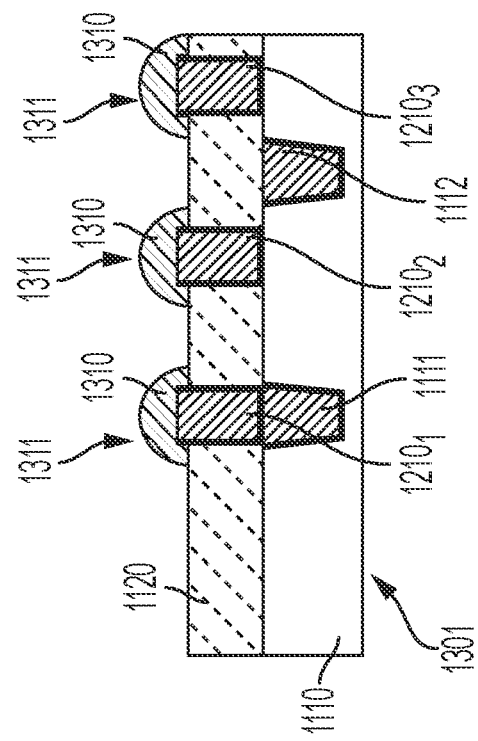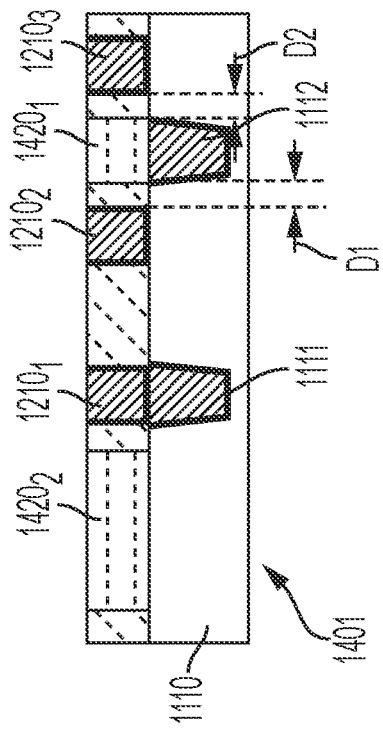

FORMING SELF-ALIGNED MULTI-METAL INTERCONNECTS

BACKGROUND

The present invention generally relates to fabrication methods and resulting structures for semiconductor devices. More specifically, the present invention relates to fabrication methods and resulting structures for self-aligned multi-metal interconnects.

Modern integrated circuits are made up of literally millions of active devices such as transistors and capacitors. These devices are initially isolated from one another but are later interconnected together to form functional circuits. The quality of the interconnection structure drastically affects the performance and reliability of the fabricated functional circuits. Interconnects and contacts are typically formed to bring and transmit electrical signals to semiconductor devices. To this end, multiple interconnect levels have been designed at certain node scales to provide wiring flexibility for system-on-chip (SOC) applications.

SUMMARY

Embodiments of the present invention are directed to an interconnect structure. A non-limiting example of the interconnect structure includes first conducting lines and second conducting lines. The first conducting lines are formed of a first metallic material and include at least one individual first conducting line in contact with a first corresponding substrate conducting line. The second conducting lines are formed of a second metallic material and include at least one individual second conducting line between neighboring first conducting lines and in contact with a second corresponding substrate conducting line. The at least one individual second conducting line is separated from each of the neighboring first conducting lines by controlled distances.

Embodiments of the present invention are directed to a method of forming self-aligned multi-metallic interconnects. A non-limiting example of the method includes surrounding first conducting lines with dielectric material such that tops of the first conducting lines are exposed through the dielectric material, selectively forming self-alignment material caps on the tops of the first conducting lines exposed through the dielectric material and forming second conducting lines between the first conducting lines with the self-alignment material caps providing self-alignment of the second conducting lines.

Embodiments of the invention are directed to a method of forming self-aligned multi-metallic interconnects. A non-limiting example of the method includes forming first conducting lines in dielectric material such that tops of the first conducting lines are exposed through the dielectric material, selectively forming self-alignment material caps on the tops of the first conducting lines exposed through the dielectric material and forming second conducting lines between the first conducting lines with the self-alignment material caps providing self-alignment of the second conducting lines.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 11 depicts an initial structure of an interconnect structure to be assembled according to second embodiments of the present invention;

FIG. 12 depicts an early stage intermediate structure of the interconnect structure to be assembled according to the second embodiments of the present invention;

FIG. 13 depicts a middle stage intermediate structure of the interconnect structure to be assembled according to the second embodiments of the present invention; and FIG. 14 depicts the interconnect structure assembled according to the second embodiments of the present invention.

Figure 1:
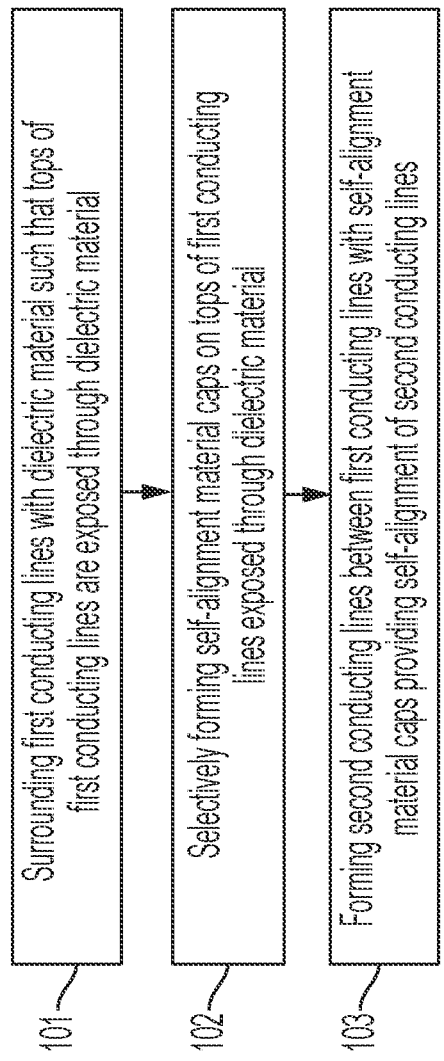
FIG. 1 is a flow diagram illustrating a method of forming self-aligned multi-metallic interconnects in accordance with embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, multiple interconnect levels have been designed at certain node scales to provide wiring flexibility for system-on-chip (SOC) applications. Aggressive dimensional scaling has resulted in a significant increase in interconnect resistances. Thus, while certain metallic materials have been used as contact metals, these metallic materials are, in many cases, no longer competitive for various reasons (i.e., because of the difficulty in scaling thick high resistivity liner/barrier films and concerns with defects). The certain metallic materials also have resistive and capacitive properties that might not always be ideal for specific applications and separation distances between conductive lines formed of the certain metallic materials cannot always be controlled.

Turning now to an overview of the aspects of the invention, one or more embodiments of the invention address the above-described shortcomings of the prior art by providing for an interconnect structure with at least two sets of conducting lines. The first set of conducting lines are formed using metal etch processes or damascene processes. The second set of conducting lines are formed using damascene processes where the materials of the first and second conducting lines can be different metallic materials and the second set of conducting lines are self-aligned with the first set of conducting lines. Separation distances between two adjacent lines of two different patterns are substantially uniform, about 15 nm or less, and do not depend on a lithographic alignment of the second pattern to the first pattern. Rather, the separation distances only depend on an amount of selective deposition, which is a uniform process, executed with respect to the first conducting lines.

The above-described aspects of the invention address the shortcomings of the prior art by providing for a formation of an interconnect structure that includes conducting lines of one or more of a same or different metallic materials with a capability of having manipulated resistive and capacitive characteristics. A litho-etch-litho-etch (LELE) process can be used to pattern lines containing different metals. Positions of conducting lines containing second metallic materials will be self-aligned with the conducting lines containing first metallic materials and will thus eliminate overlay constraints of LELE processes for tight pitch patterns.

Turning now to a more detailed description of aspects of the present invention, FIG. 1 depicts a method of forming self-aligned multi-metallic interconnects in accordance with first embodiments of the present invention. As shown in FIG. 1, the method includes surrounding first conducting lines with dielectric material such that tops of the first conducting lines are exposed through the dielectric material 101. The method also includes selectively forming self-alignment material caps on the tops of the first conducting lines exposed through the dielectric material 102. In addition, the method includes forming second conducting lines between the first conducting lines with the self-alignment material caps providing self-alignment of the second conducting lines 103.

In accordance with embodiments of the present invention, the self-alignment material caps may include one or more of high-k dielectric material, zirconium oxide, hafnium oxide, lanthanum oxide, tantalum nitride, titanium nitride and titanium oxide.

The method of FIG. 1 will be further described below with reference to FIGS. 2-9.

Figure 2:
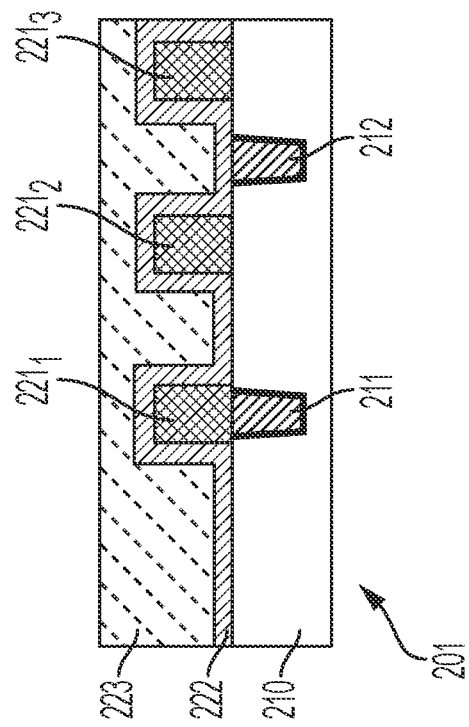
FIG. 2 depicts an initial structure of an interconnect structure to be assembled according to first embodiments of the present invention.

With reference to FIG. 2, an initial structure 201 of an interconnect structure to be assembled according to first embodiments of the present invention is illustrated. The initial structure 201 includes a substrate metallization layer 210 in which first and second substrate conducting lines 211 and 212 are disposed. The initial structure 201 further includes first conducting lines $221_1$, $221_2$ and $221_3$, first dielectric material 222 and second dielectric material 223. The first conducting lines $221_1$, $221_2$ and $221_3$ are formed of metallic material that is capable of being etched, such as one or more of ruthenium, tungsten, aluminum and titanium nitride, and are patterned using a metal etch process or a damascene process such that the first conducting line $221_1$ is disposed in contact with the first substrate conducting line 211 and such that the first conducting lines $221_2$ and $221_3$ are disposed on either side of the second substrate conducting line 212. The first dielectric material 222 can be a spacer dielectric such as silicon oxide or silicon nitride or a low-k dielectric and can be formed by a depositional process, such as atomic layer deposition (ALD), as a spacer. The second dielectric material 223 can be silicon oxide or silicon nitride or a low-k dielectric and fills spaces defined between portions of the first dielectric material 222 by a depositional process, such as low-k deposition.

It should be noted that the first dielectric material 222 does not play any role in self-alignment. Therefore, the use of the first dielectric material 222 is optional and can be omitted in certain embodiments of the present invention without impacting any aspect of the present invention.

Figure 3:
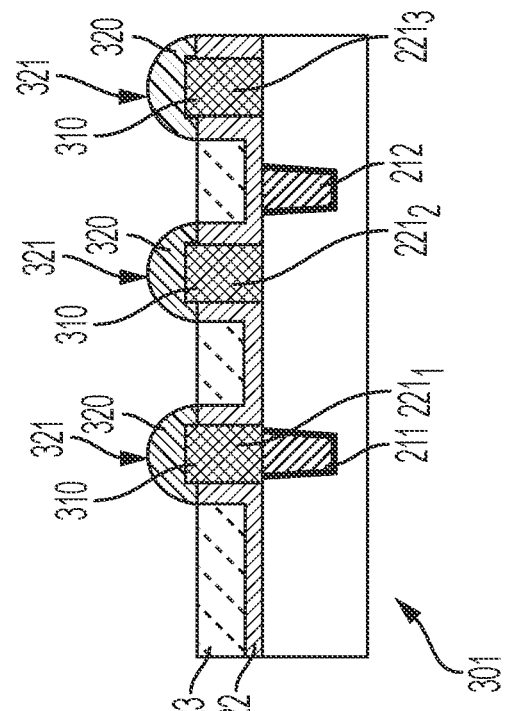
FIG. 3 depicts an early stage intermediate structure of the interconnect structure to be assembled according to the first embodiments of the present invention.

With reference to FIG. 3, an early stage intermediate structure 301 of the interconnect structure to be assembled according to the first embodiments of the present invention is illustrated and is representative of processing executed with respect to the initial structure 201 of FIG. 2. This processing includes a chemical mechanical polishing (CMP) and a dielectric etch back of the first and second dielectric materials 222 and 223 that results in tops 310 of the first conducting lines $221_1$, $221_2$ and $221_3$ being exposed. The processing also includes a preferential deposition of self-alignment material, such as one or more of one or more of high-k dielectric material, zirconium oxide, hafnium oxide, lanthanum oxide, tantalum nitride, titanium nitride and titanium oxide, whereby self-alignment material caps 320 are selectively formed on the exposed tops 310 of the first conducting lines $221_1$, $221_2$ and $221_3$.

In accordance with embodiments of the present invention, the self-alignment material caps 320 have a mushroom shape 321 and can be formed as a result of an ALD process in which overgrowth of the self-alignment material caps 320 around the metallic surfaces of the exposed tops 310 of the first conducting lines $221_1$, $221_2$ and $221_3$ is controlled by ALD cycle timing.

Figure 4:
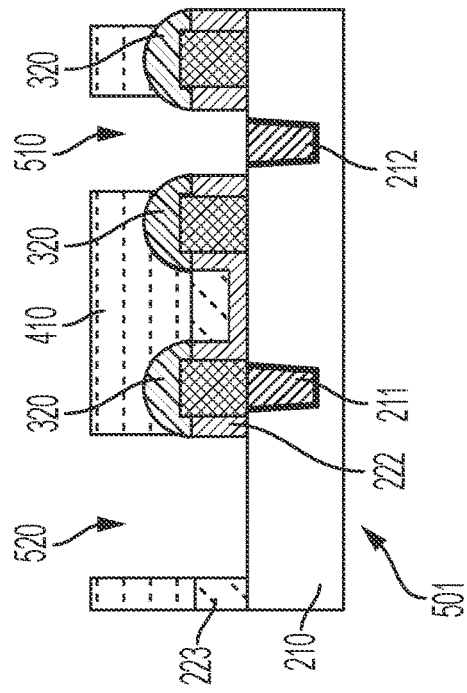
FIG. 4 depicts a middle stage intermediate structure of the interconnect structure to be assembled according to the first embodiments of the present invention.

With reference to FIG. 4, a middle stage intermediate structure 401 of the interconnect structure to be assembled according to the first embodiments of the present invention is illustrated and is representative of processing executed with respect to the early stage intermediate structure 301 of FIG. 3. This processing includes a deposition of organic planarization layer (OPL) material 410, silicon anti-reflective coating 420 and photoresist material 430, which is patterned in a general sense to match the desired pattern for second conducting lines.

Figure 5:
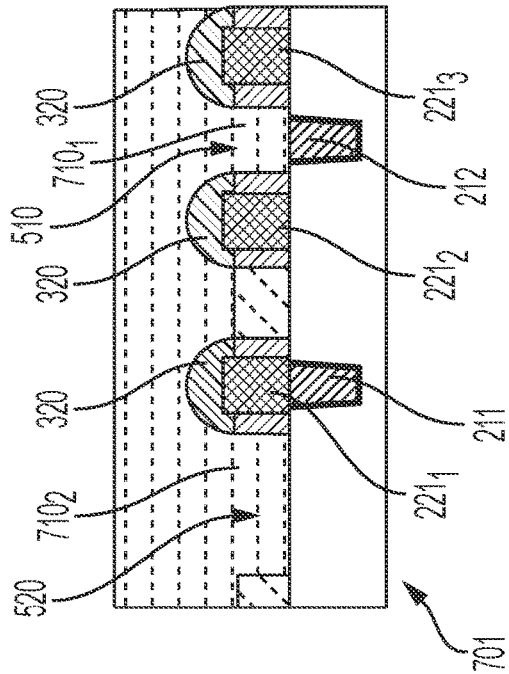
FIG. 5 depicts another middle stage intermediate structure of the interconnect structure to be assembled according to the first embodiments of the present invention.

With reference to FIG. 5, another middle stage intermediate structure 501 of the interconnect structure assembled according to the first embodiments of the present invention is illustrated and is representative of processing executed with respect to the middle stage intermediate structure 401 of FIG. 4. This processing includes, among other things, a self-aligned etch of the first and second dielectric materials 222 and 223 which results in the OPL material 410 remaining only in those regions where the photoresist material was present. The self-aligned etch of the first and second dielectric materials 222 and 223 results in the formation of first and second trenches 510 and 520 and the exposure of the second substrate conducting line 212 through the first trench 510 as well as the exposure of the surface of the substrate metallization layer 210 through the second trench 520.

As shown in FIG. 5, the first trench 510 is narrower than the second trench 520, the first trench 510 is bordered by edges of the OPL material 410, corners of proximal self-alignment material caps 320 and spacer-shaped remainders of the first dielectric material 222 and the second trench 520 is bordered by edges of the OPL material 410, a corner of a proximal self-alignment material cap 320, a spacer-shaped remainder of the first dielectric material 222 and a remainder of the second dielectric material 223.

Figure 6:
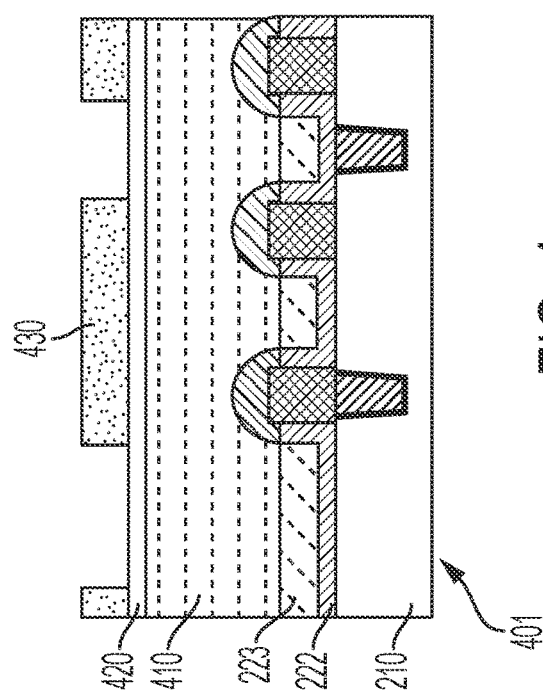
FIG. 6 depicts yet another middle stage intermediate structure of the interconnect structure to be assembled according to the first embodiments of the present invention.

With reference to FIG. 6, yet another middle stage intermediate structure 601 of the interconnect structure to be assembled according to the first embodiments of the present invention is illustrated and is representative of processing executed with respect to the middle stage intermediate structure 501 of FIG. 5. This processing includes an ash of the remaining OPL material 410 whereby the first and second trenches 510 and 520 remain but are shorter in the height-wise dimension.

Figure 7:
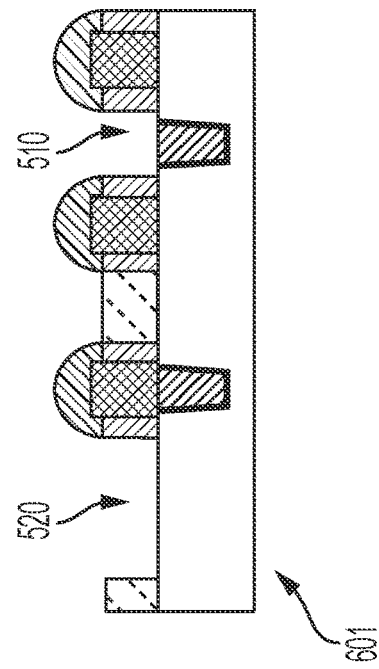
FIG. 7 depicts a late middle stage intermediate structure of the interconnect structure to be assembled according to the first embodiments of the present invention.

With reference to FIG. 7, a late middle stage intermediate structure 701 of the interconnect structure to be assembled according to the first embodiments of the present invention is illustrated and is representative of processing executed with respect to the middle stage intermediate structure 601 of FIG. 6. This processing includes a deposition of metallic materials by a damascene process at least into the remaining first and second trenches 510 and 520 to form what will be second conducting lines $710_1$ and $710_2$. The metallic materials of the resulting second conducting lines $710_1$ and $710_2$ can be different from the metallic materials of the first conducting lines $221_1$, $221_2$ and $221_3$ and can include one or more of cobalt, copper, ruthenium and tungsten. The second conducting line $710_1$ will be narrower than the second conducting line $710_2$ and disposed in contact with the second substrate conducting line 212 between the spacer-shaped remainders of the first dielectric material 222 and the neighboring first conducting lines $221_2$ and $221_3$.

Figure 8:
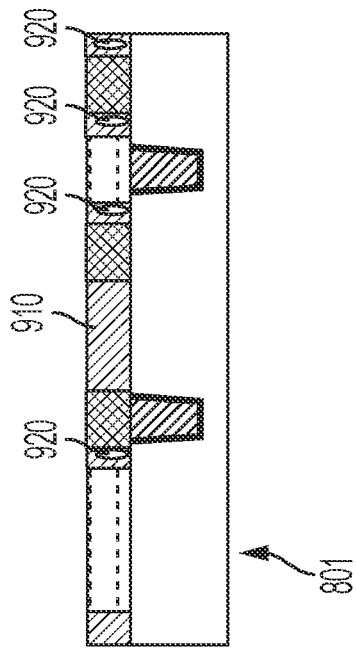
FIG. 8 depicts the interconnect structure assembled according to the first embodiments of the present invention.

With reference to FIG. 8, an interconnect structure 801 assembled according to the first embodiments of the present invention is illustrated and results from processing executed with respect to the late middle stage intermediate structure 701 of FIG. 7. This processing includes metal and self-alignment cap material CMP. The interconnect structure 801 thus includes the substrate metallization layer 210 including the first and second substrate conducting lines 211 and 212 and a second metallization layer 810 that is disposed on the substrate metallization layer 210. A shown in FIG. 8, the second metallization layer 810 includes the first conducting lines $221_1$, $221_2$ and $221_3$ and the second conducting lines $710_1$ and $710_2$ formed as described above where the second conducting line $710_1$ is separated from the neighboring first conducting lines $221_2$ and $221_3$ by controlled distances D1 and D2.

The controlled distances D1 and D2 are controlled by the control of the ALD cycle times executed during the formation of the self-alignment material caps 320. This control allowed for a control of the overgrowth of self-alignment material caps 320, for an effective control of the width of the first trench 510 and thus for an effective control of the positioning and the width of the second conducting line $710_1$.

Figure 9:
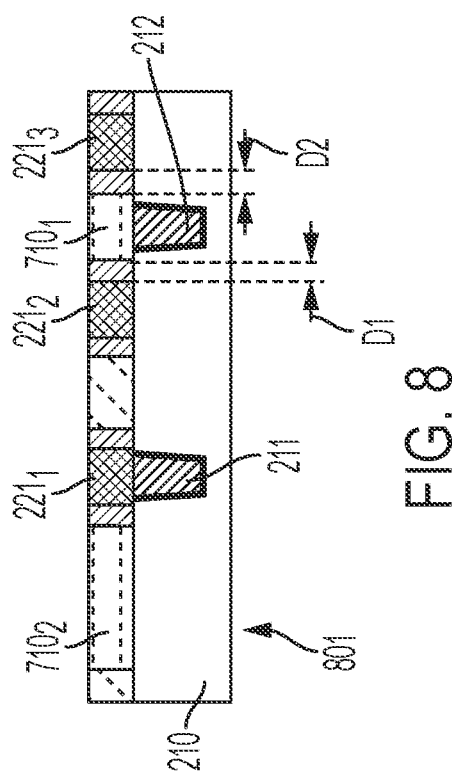
FIG. 9 depicts additional features of the interconnect structure assembled according to the first embodiments of the present invention.

With reference to FIG. 9, additional features of the interconnect structure 801 of FIG. 8 are illustrated. These additional structures result from a dielectric wet or dry etch back of the first and second dielectric materials 222 and 223 remaining in the interconnect structure 801 and a replacement thereof with low-k dielectric materials 910 and air gaps 920.

Figure 10:
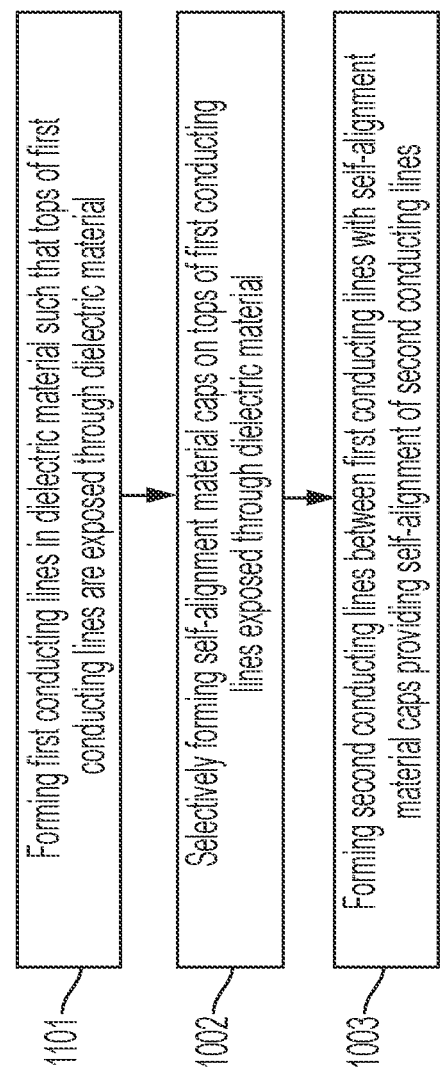
FIG. 10 is a flow diagram illustrating a method of forming self-aligned multi-metallic interconnects in accordance with embodiments of the present invention.

FIG. 10 depicts a method of forming self-aligned multi-metallic interconnects in accordance with second embodiments of the present invention. As shown in FIG. 10, the method includes forming first conducting lines in dielectric material such that tops of the first conducting lines are exposed through the dielectric material 1001. In addition, the method includes selectively forming self-alignment material caps on the tops of the first conducting lines exposed through the dielectric material 1002. The method also includes forming second conducting lines between the first conducting lines with the self-alignment material caps providing self-alignment of the second conducting lines 1003.

In accordance with embodiments of the present invention, the self-alignment material caps may include one or more of high-k dielectric material, zirconium oxide, hafnium oxide, lanthanum oxide, tantalum nitride, titanium nitride and titanium oxide.

The method of FIG. 10 will be further described below with reference to FIGS. 11-17.

With reference to FIG. 11, an initial structure 1101 of an interconnect structure to be assembled according to second embodiments of the present invention is illustrated. The initial structure 1101 includes a substrate metallization layer 1110 in which first and second substrate conducting lines 1111 and 1112 are disposed. The initial structure 1101 further includes a low-k dielectric material layer 1120, a sacrificial layer 1130 of silicon nitride or another similar material and an upper layer 1140 of titanium nitride or another similar material. The low-k dielectric material layer 1120, the sacrificial layer 1130 and the upper layer 1140 are formed to define trenches $1150_1$, $1150_2$ and $1150_3$. The trenches $1150_1$, $1150_2$ and $1150_3$ are defined as a result of a pattern transfer process from an original lithographic pattern (see, e.g., FIG. 4) whereby the trench $1150_1$ is disposed to extend upwardly from the first substrate conducting line 1111 and the trenches $1150_2$ and $1150_3$ are disposed to extend upwardly at either side of the second substrate conducting line 1112.

With reference to FIG. 12, an early stage intermediate structure 1201 of the interconnect structure to be assembled according to the second embodiments of the present invention is illustrated and is representative of processing executed with respect to the initial structure 1101 of FIG. 11. This processing includes a deposition of metallic materials that can include non-etchable metallic materials or, more particularly, one or more of cobalt, copper, ruthenium and tungsten, and subsequent CMP and low-k dielectric material etch back processes. The processing thus results in the formation of first conducting lines $1210_1$, $1210_2$ and $1210_3$ in the trenches $1150_1$, $1150_2$ and $1150_3$, respectively, such that the first conducting line $1210_1$ is disposed in contact with the first substrate conducting line 1111 and the first conducting lines $1201_2$ and $1210_3$ are disposed at either side of the second substrate conducting line 1112. The processing further results in the tops 1220 of the first conducting lines $1210_1$, $1201_2$ and $1210_3$ being exposed.

With reference to FIG. 13, a middle stage intermediate structure 1301 of the interconnect structure to be assembled according to the second embodiments of the present invention is illustrated and is representative of processing executed with respect to the early stage intermediate structure 1201 of FIG. 12. This processing includes a preferential deposition of self-alignment material, such as one or more of one or more of high-k dielectric material, zirconium oxide, hafnium oxide, lanthanum oxide, tantalum nitride, titanium nitride and titanium oxide, whereby self-alignment material caps 1310 are selectively formed on the exposed tops 1220 of the first conducting lines $1210_1$, $1210_2$ and $1210_3$.

In accordance with embodiments of the present invention, the self-alignment material caps 1310 have a mushroom shape 1311 and can be formed as a result of an ALD process in which overgrowth of the self-alignment material caps 1310 around the metallic surfaces of the exposed tops 1220 of the first conducting lines $1210_1$, $1210_2$ and $1210_3$ is controlled by ALD cycle timing.

Subsequent processing of the interconnect structure to be formed according to the second embodiments of the present invention is similar to the processing illustrated in FIGS. 5-7 and described in the accompanying text above and does not need to be described again.

With reference to FIG. 14, this subsequent processing results in the formation of interconnect structure 1401. The interconnect structure 1401 includes the substrate metallization layer 1110 including the first and second substrate conducting lines 1111 and 1112 and a second metallization layer 1410 that is disposed on the substrate metallization layer 1110. A shown in FIG. 14, the second metallization layer 1410 includes the first conducting lines $1210_1$, $1210_2$ and $1210_3$ and second conducting lines $1420_1$ and $1420_2$. The second conducting line $1420_1$ is narrower than the second conducting line $1420_2$. The second conducting line $1420_1$ is disposed in contact with the second substrate conducting line 1112 between spacer-shaped remainders of low-k dielectric material and the neighboring first conducting lines $1210_2$ and $1210_3$. The second conducting line $1420_1$ is separated from the neighboring first conducting lines $1210_2$ and $1210_3$ by controlled distances D1 and D2.

The controlled distances D1 and D2 are controlled by the control of the ALD cycle times executed during the formation of the self-alignment material caps 1310. This control allowed for a control of the overgrowth of the self-alignment material caps 1310, for an effective control of the width trench in which the second conducting line $1420_1$ is disposed and thus for an effective control of the positioning and the width of the second conducting line $1420_1$.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An interconnect structure, comprising:
   first conducting lines formed of a first metallic material and including at least one individual first conducting line in contact with a first corresponding substrate conducting line; and
   second conducting lines formed of a second metallic material and including at least one individual second conducting line between neighboring first conducting lines and in contact with a second corresponding substrate conducting line;

the at least one individual second conducting line being separated from each of the neighboring first conducting lines by controlled distances, wherein:

a pair of the first conducting lines comprise oppositely facing first conducting line sidewalls, the interconnect structure further comprises dielectric material surrounding the first conducting lines such that tops of the first conducting lines are exposed through the dielectric material, a section of the dielectric material between the pair of the first conducting lines being formed as spacer-shaped remainders abutting the oppositely facing first conducting line sidewalls, the interconnect structure further comprises self-alignment caps disposed on tops of the first conducting lines and the spacer-shaped remainders, the self-alignment caps comprising a mushroom shape with a rounded upper surface that smoothly interfaces with the oppositely facing sidewalls of the spacer-shaped remainders, and the self-alignment caps determining the controlled distances.

2. The interconnect structure according to claim 1, wherein separation between adjacent ones of the first conducting lines, the second conducting lines or the first and second conducting lines is about 15 nm or less.

3. The interconnect structure according to claim 1, wherein:

the first conducting lines comprise one or more of tungsten, aluminum and titanium nitride or one or more of cobalt, copper, ruthenium and tungsten; and the second conducting lines comprise one or more of cobalt, copper, ruthenium and tungsten.

4. The interconnect structure according to claim 1, wherein the at least one individual second conducting line is narrower than another individual second conducting line.

5. A method of forming self-aligned multi-metallic interconnects according to the interconnect structure of claim 1, the method comprising:

forming the first conducting lines in the dielectric material such that the tops of the first conducting lines are exposed through the dielectric material;

selectively forming the self-alignment caps on the tops of the first conducting lines exposed through the dielectric material; and forming the second conducting lines between the first conducting lines with the self-alignment caps providing self-alignment of the second conducting lines.

6. The method according to claim 5, further comprising:

transferring a lithographic pattern into the dielectric material to define patterned dielectric material; and depositing metallic material of the first conducting lines into the patterned dielectric material.

7. The method according to claim 5, wherein the first conducting lines comprise non-etchable metallic materials.

8. The method according to claim 5, wherein the self-alignment caps comprise one or more of zirconium oxide, hafnium oxide, lanthanum oxide, tantalum nitride, titanium nitride and titanium oxide.

9. The method according to claim 5, wherein each of the self-alignment caps has the mushroom shape.

10. The method according to claim 5, wherein:

selectively forming the self-alignment caps comprises depositing self-alignment cap material using atomic layer deposition (ALD), and the method further comprises controlling overgrowth of the self-alignment cap material around metallic surfaces of the first conducting lines by ALD cycle time.

11. The method according to claim 5, wherein:

the first conducting lines comprise one or more of cobalt, copper, ruthenium and tungsten, and the second conducting lines comprise one or more of cobalt, copper, ruthenium and tungsten.

12. A method of forming self-aligned multi-metallic interconnects according to the interconnect structure of claim 1, the method comprising:

forming the first conducting lines in the dielectric material such that the tops of the first conducting lines are exposed through the dielectric material by formation of the section of the dielectric material between the pair of the first conducting lines into the spacer-shaped remainders of the dielectric material that abut the oppositely facing sidewalls of the pair of the first conducting lines and by a controlling of widths between the oppositely facing sidewalls of the spacer-shaped remainders to effectively control positionings and widths of the second conducting lines to be later formed;

selectively forming the self-alignment caps on the tops of the first conducting lines exposed through the dielectric material and on tops of the spacer-shaped remainders of the dielectric material; and forming the second conducting lines between the first conducting lines and the spacer-shaped remainders of the dielectric material with the self-alignment caps providing self-alignment of the second conducting lines and with the widths between the self-alignment caps determining the positionings and the widths of the second conducting lines.

13. The method according to claim 12, further comprising:

transferring a lithographic pattern into the dielectric material to define patterned dielectric material; and depositing metallic material of the first conducting lines into the patterned dielectric material.

14. The method according to claim 12, wherein the first conducting lines comprise non-etchable metallic materials.

15. The method according to claim 12, wherein the self-alignment caps comprise one or more of zirconium oxide, hafnium oxide, lanthanum oxide, tantalum nitride, titanium nitride and titanium oxide.

16. The method according to claim 12, wherein each of the self-alignment caps has the mushroom shape with the rounded upper surface.

17. The method according to claim 12, wherein:

selectively forming the self-alignment caps comprises depositing self-alignment cap material using atomic layer deposition (ALD), and the method further comprises controlling overgrowth of the self-alignment cap material around metallic surfaces of the first conducting lines by ALD cycle time.

18. The method according to claim 12, wherein:

the first conducting lines comprise one or more of cobalt, copper, ruthenium and tungsten, and the second conducting lines comprise one or more of cobalt, copper, ruthenium and tungsten.

* * * * *